(12) United States Patent
Shimizu (10) Patent No.: US 6,462,533 B1
(45) Date of Patent: Oct. 8, 2002

(54) IC TEST SYSTEM FOR TESTING BGA PACKAGES

(75) Inventor: Jun Shimizu, Kusatsu (JP)

(73) Assignee: NEC Machinery Corporation (JP)

( * ) Notice: Subject to any disclaimer, the term of this patent is extended or adjusted under 35 U.S.C. 154(b) by 1 day.

(21) Appl. No.: 09/723,869

(22) Filed: Nov. 28, 2000

(30) Foreign Application Priority Data

Nov. 30, 1999 (JP) .......................................... 11-339854

(51) Int. Cl.[7] .............................................. G01R 31/22
(52) U.S. Cl. ..................... 324/158.1; 324/754; 324/758; 324/537; 324/755
(58) Field of Search ............................... 324/755, 754, 324/758, 158.1, 537

(56) References Cited

U.S. PATENT DOCUMENTS

| | | | |
|---|---|---|---|
| 5,177,434 | * | 1/1993 | Suzuki et al. ................ 324/755 |
| 5,184,068 | * | 2/1993 | Twigg et al. ................ 324/755 |
| 5,453,699 | * | 9/1995 | Makashita et al. ........... 324/754 |
| 5,678,301 | * | 10/1997 | Gochnour et al. ............. 29/827 |
| 6,204,676 | * | 3/2001 | Hsieh et al. .................. 324/755 |
| 6,218,852 | * | 4/2001 | Smith et al. .................. 324/761 |
| 6,229,323 | * | 5/2001 | Tverdy et al. ................ 324/758 |
| 6,339,321 | * | 1/2002 | Yamashita et al. ......... 324/158.1 |

FOREIGN PATENT DOCUMENTS

JP        2001-51018        2/2001        ........... G01R/31/26

* cited by examiner

*Primary Examiner*—N. Le
*Assistant Examiner*—T. R. Sundaram
(74) *Attorney, Agent, or Firm*—Hayes Soloway, P.C.

(57) ABSTRACT

An IC test system includes a socket having a plurality of contact pins, a positioning member for positioning an IC package for testing, a carriage arm for transferring the IC package positioned by the positioning member to the socket. The socket, positioning member and the carriage arm are fixed to the base of the test system via a common base plate. Vibration caused by the carriage arm is commonly transferred to the socket and the positioning member, whereby a suitable alignment of IC package with respect to the socket can be obtained.

5 Claims, 6 Drawing Sheets

IC TEST SYSTEM FOR TESTING BGA PACKAGES

BACKGROUND OF THE INVENTION (a) Field of the Invention

The present invention relates to an IC test system for testing IC packages such as BGA (ball grid array) packages.

(b) Description of the Related Art

Figure 1A:
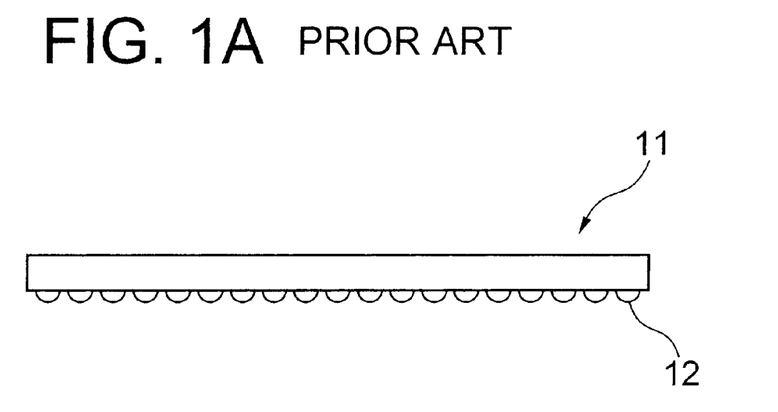
FIGS. 1A and 1B are a side view and a bottom view of a general BGA package.
Figure 1B:
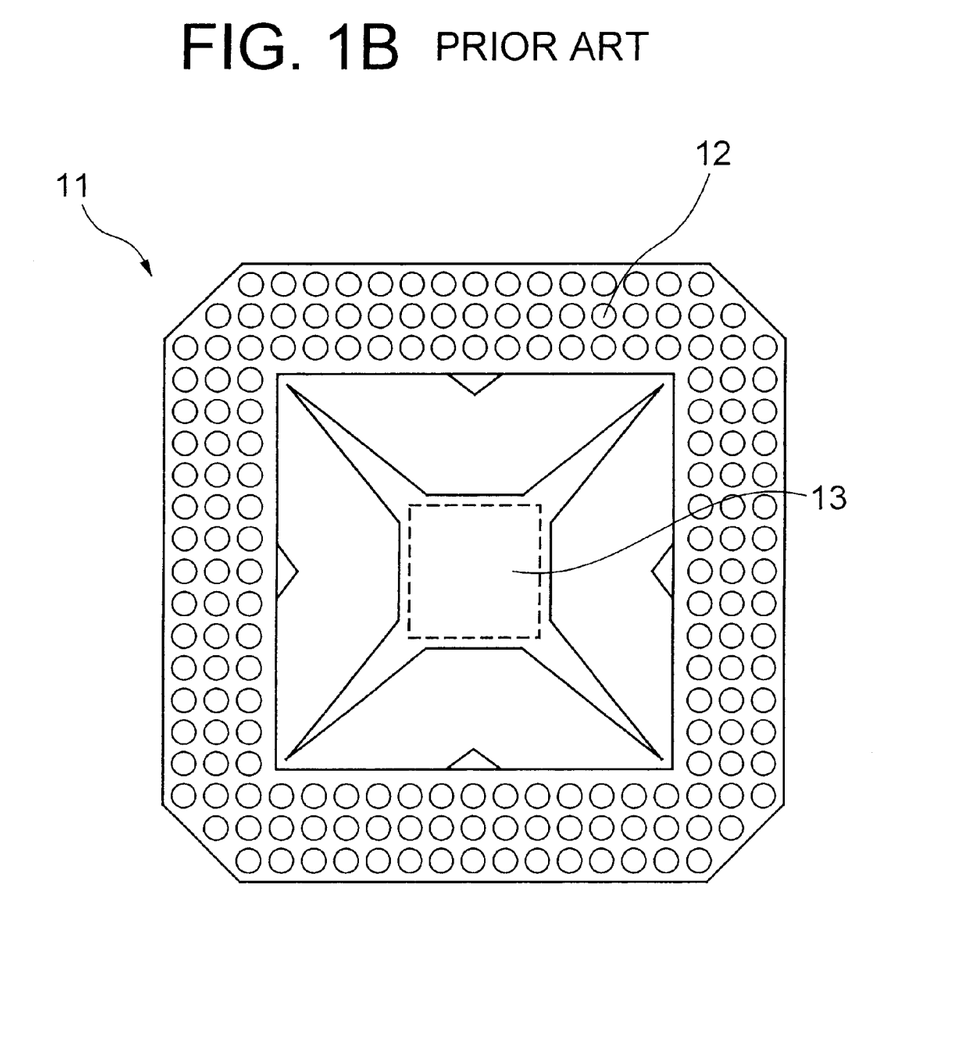

BGA LSIs are increasingly used along with a higher integration of the LSI packages. FIGS. 1A and 1B are side view and a bottom view of a package of a BGA LSI. The BGA package 11 is substantially of a square having a 5×5 mm to 50×50 mm size with a thickness of 0.5 to 3 mm. A large number of solder balls 12 are mounted on the bottom surface of the package at the peripheral area thereof, and a LSI 13 is embedded at the central area of the package. A plurality of bonding wires extend within the BGA package between the LSI 13 and the solder balls 12. The BOA package is mounted on a printed circuit board with the bottom surface mounting thereon the solder balls 12 being in contact with the top surface of a printed circuit board, and coupled thereto by thermally melting the solder balls for electric and mechanical connection between the solder balls and the terminals of the printed circuit board.

The solder balls 12 are arranged in an array on the outer periphery of the package. Each of the solder balls 12 is of a sphere having a diameter of around 0.3 mm and projects from the bottom surface. The number of the solder balls 12 in a LSI package may be as high as several hundreds to a thousand in a high-integrated LSI, wherein the pitch of the solder balls may be as low as 0.5 mm. In view of the higher integration of the next generation LSI together with demand for a smaller package size on the printed circuit board, a higher density for the arrangement of the solder balls 12 is desired in the BGA package.

For testing or measuring the electric characteristics of the BGA package, a test instrument (or test socket) is generally used which has an array of contact pins arranged in a pitch corresponding to the pitch of the solder balls 12. The contact pins are attached to the test socket so that the contact pins advance and retract to/from the socket by a spring function. More specifically, the contact pin has a compression spring at the bottom thereof and the contraction of the spring provides a thrust force for a suitable electric contact between the contact pin and the solder ball. Thus, a tip of the contact pin exerts a thrust force to the solder ball during the abutment thereto.

Figure 2A:
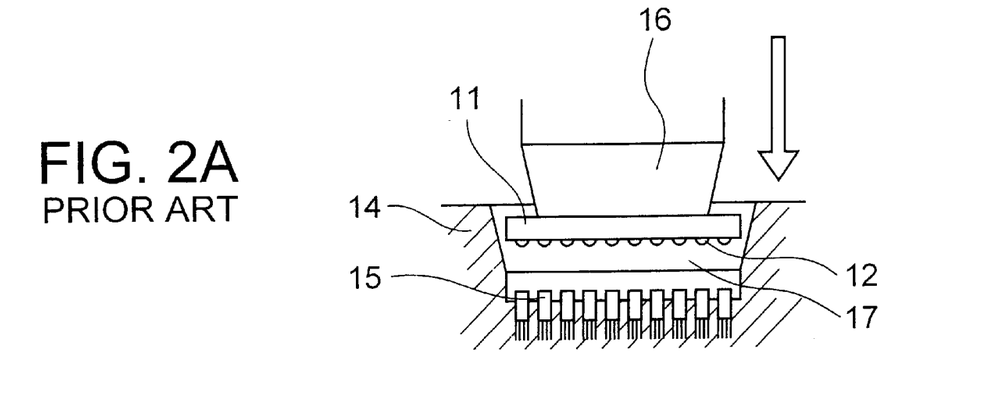
FIGS. 2A to 2D are sectional views of a portion of a test socket, consecutively showing the process for positioning a BGA package onto contact pins of the test socket.

FIGS. 2A to 2D show sectional views of a depression of a test socket, consecutively show the advancement of a BGA package 11 toward the contact pins 15 disposed in the depression. A suction head 16 holds the BOA package 11 at the top surface thereof by vacuum suction and moves in the horizontal direction for positioning of the BGA package 11 with respect to the test socket 14. The suction tool 16 then moves downward or toward the depression 17 of the socket 14, as shown in FIG. 2A, and allows the BGA package 11 to drop within the depression 17 by stopping the vacuum suction, as shown in FIG. 2A. The depression 17 has a tapered wall portion at each side of the square and an additional straight wall portion at the bottom of the depression 17.

Figure 2B:
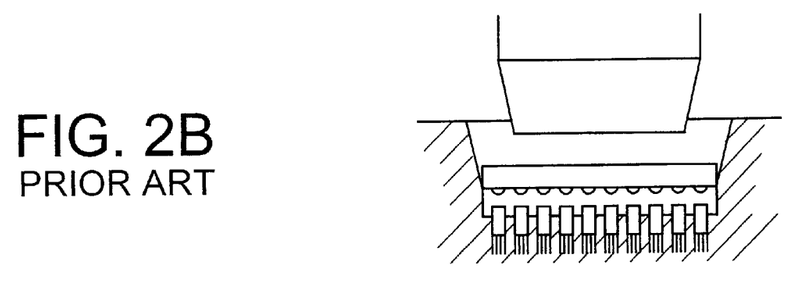
Figure 2C:
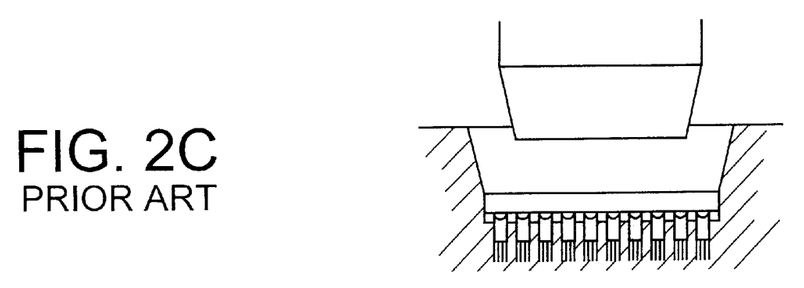
Figure 2D:
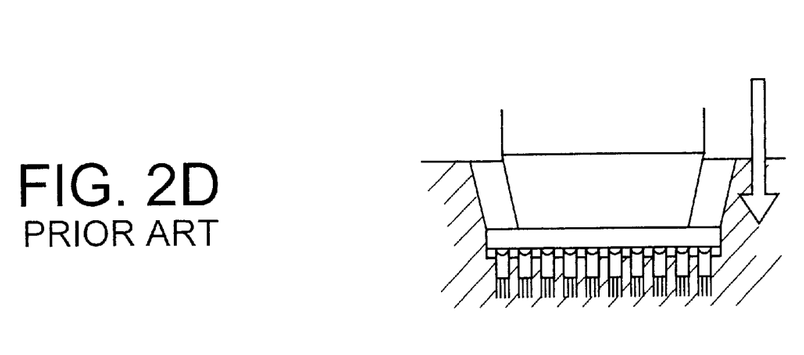
Figure 3:
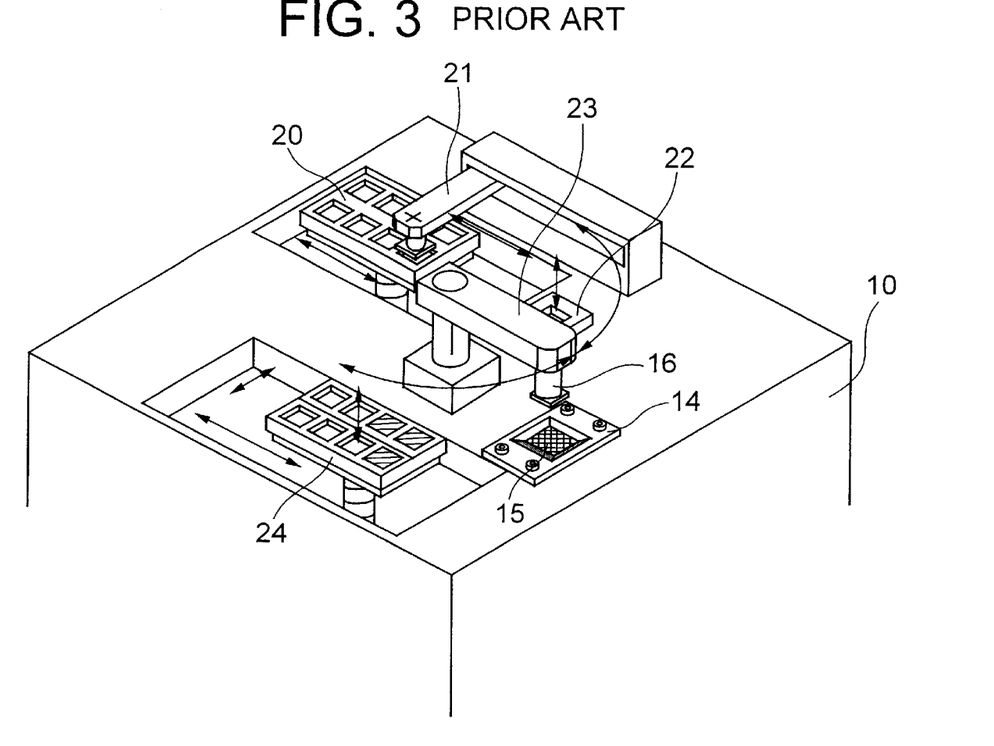
FIG. 3 is a perspective view of the IC test system having the test socket shown in FIGS. 2A to 2D.

The BGA package 11 slides along the tapered wall of the depression 17, as shown in FIG. 2B, and stops at the straight wall portion, as shown in FIG. 2C, where the solder balls 12 are aligned with the contact pins 15 of the test socket 14. The suction head 16 then further moves downward to thrust the BGA package 11 with a specific contact pressure, as shown in FIG. 2D, to obtain electric contacts between the solder balls 12 and the contact pins 15. Thereafter, an electric test is conducted for the BGA package 11, FIG. 3 shows the structure of a conventional IC test system, which includes a base 10, a carry-in tray 20, a first carriage arm 21, a positioning member 22, a second carriage arm 23, socket 14, and a carry-out tray 24. Both the carriage arms 21 and 23 have respective suction heads 16 for holding and releasing the BGA package 11. In the drawing, a top cover is not shown which covers the top surface or table of the base 10 of the test system.

The first carriage arm 21 moves straight, then allows the suction head 16 to move in the vertical direction, thereby transferring the BGA packages 11 before testing one by one from the carry-in tray 20 to the positioning member 22, which positions the BOA package 11 based on the external shape thereof.

The second carriage arm 23 turns horizontally about its vertical axis to allow the suction head 16 to move in the horizontal direction, thereby carrying the positioned BGA package 11 to the socket 14. The BGA package 11 is dropped therein, as described before, and subjected to testing thereof. After the testing, the BGA package 11 is transferred to the carry-out tray 24 and temporarily stored thereon for waiting carry-out thereof.

Figure 4A:
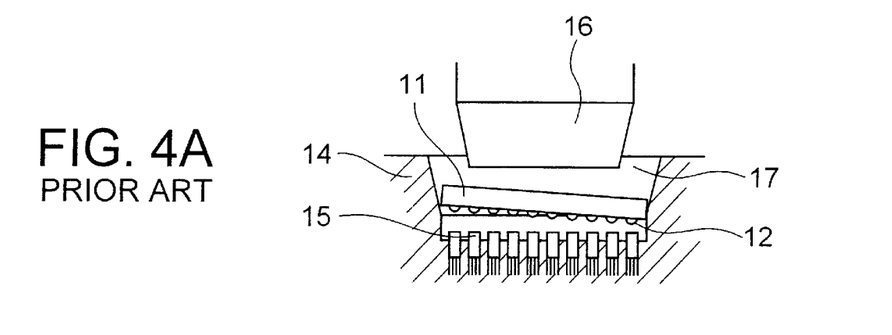
FIGS. 4A and 4B are sectional view of the portion shown is in FIGS. 2A to 2D showing the problem therein.

In the conventional IC test system, as shown in FIG. 4A, it sometimes happens that the BGA package 11 is not smoothly dropped by the suction head 16 to the bottom of the depression along the taper wall, whereby an edge of the BGA package 11 is stopped by the taper wall. In this case, the suction head 16 which thrusts the BGA package 11 against the contact pins 15 may damage the BGA package 11 by an excessive thrust force exerted from above. This often happens when the second carriage arm 23 drops the BGA package 11 before the vibration of the second carriage arm 23 is stopped, or when the socket 14 receives a vibration (or waggle) from other members.

The excessive external force is also applied to the contact pins 15 in a horizontal direction as well as the vertical direction. The contact pins 15 are extendable in the vertical direction to some extent as described before. However, the contact pins 15 are susceptible to the horizontal thrust force and are bent thereby due to the fragility of the contact pins 15 having a diameter around 0.3 mm. Even if only one of the contact pins 15 is bent and cannot move in the vertical direction, the testing cannot be not carried out because the all the contact pins 15 are not likely in electrical contact with the solder balls 12.

Figure 4B:
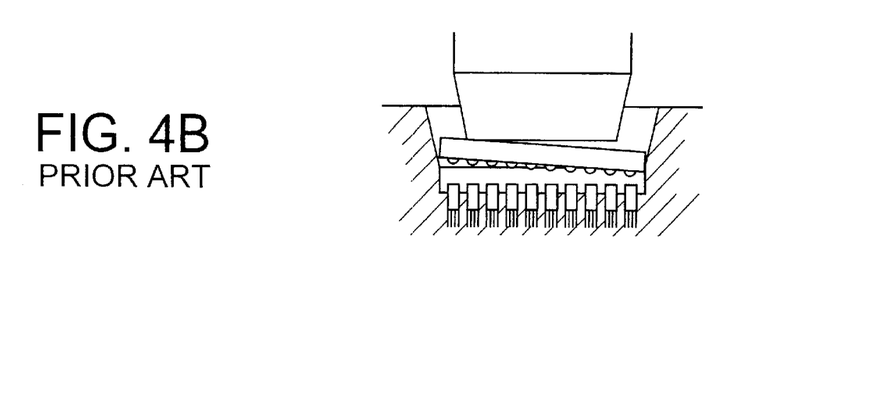

In addition, it may also happen that the contact pins 15 are not in a suitable abutment against the solder balls even if the BGA package 11 is dropped to the bottom of the depression 17. This happens when the solder balls 12 are not correctly arranged with respect to the external shape of the BGA package 11. For example, if the orientation of the solder ball array is deviated from the orientation of the BGA package 11, the contact pins are not in a suitable abutment against the centers of the solder balls and are thus subjected to an undesirable external force in the horizontal direction upon the thrust by the suction head 16. This may cause peeling-off of the solder balls 12 from the BGA package 11 or damage to the contact pins 15.

In either case, a failed contact pin must be replaced by a new contact pin. The contact pin is fragile due to the extremely small diameter thereof and is difficult to settle on the socket without a skill. This necessitates the replacement of the whole socket on the user side of the test system, the cost of which is a heavy burden on the user.

The present inventors proposed in an earlier Japanese application No. 11-230237 for solving the above problems, wherein the positioning of the BGA package is carried out on the basis of the arrangement of the respective solder balls, the image of which is taken by a CCD camera and stored beforehand. This allows the solder balls to be in a suitable alignment with the contact pins In addition, the proposed technique uses a suction head which thrusts the BGA package so as to allow the solder balls to be in abutment against the contact pins while holding the BGA package without dropping.

The proposed technique achieved a significant solution for the above problems; however, it was not in fact satisfactory. This is because the vibration of the test system causes a failure in the electric contact between the solder balls and the contact pins.

More specifically, in the proposed test system, the main components such as the carriage arms, test socket and positioning member are respectively fixed onto the top table of the test system by using bolts and nuts. Among others, the carriage arms cause a vibration (or waggle) on the test system, which is not necessarily transferred to the socket. That is, it happens that the vibration is left on the carriage arm whereas the socket is not subjected to the vibration or waggle. If a significant time length is inserted for waiting the convergence of the vibration on the carriage arm, a satisfactory test result may be obtained. However, in this case, the throughput of the testing is degraded.

On the other hand, there may be a case wherein the test socket is subjected to vibration of other members such as a tray drive when the carriage arm moves downward to thrust the BGA package toward the socket without vibration of the carriage arm itself. The socket is likely subjected to a vibration because the vicinity of the socket is hardly provided with a reinforcement member for preventing the vibration of the test system partly due to the presence of a cable box used for the socket. In this case, a correct test is not conducted either.

In particular, in the case of a higher integrated BGA package such as mounting thereon solder balls having a diameter of 0.3 mm and arranged with a pitch of 0.5 mm, a correct test is difficult to achieve due to small vibrations or waggles respectively occurring on the socket and associated members Along with the higher integration and increased number of solder balls in the BGA packages, the above problems are considered to be critical in the test of the BGA packages.

SUMMARY OF THE INVENTION

It is an object of the present invention to provide an improved test system, which is capable of solving the above problems caused by the vibrations or waggles in the test system.

The present invention provides a IC test system comprising a base a socket including a plurality of contact pins, a positioning member for positioning an IC package with respect to the contact pins, a carriage arm for carrying the IC package positioned by the positioning member to the socket so that external terminals of the IC package are in contact with is the contact pins, and an IC tester for testing electric characteristics of the IC package, wherein the socket, the positioning member and the carriage arm are fixed to a common plate member fixed to the base.

In accordance with the present invention, the common plate member transfers the vibration caused by one of the socket, positioning member and the carriage arm in the test system equally to the other of the socket, positioning member and the carriage arm, whereby these members vibrate similarly to each other and thus an incorrect positioning caused by the vibration as encountered in the conventional test system can be prevented.

The above and other objects, features and advantages of the present invention will be more apparent from the following description, referring to the accompanying drawings.

PREFERRED EMBODIMENTS OF THE INVENTION

Now, the present invention is more specifically described with reference to accompanying drawings, wherein similar constituent elements are designated by similar reference numerals throughout the drawings.

Figure 5:
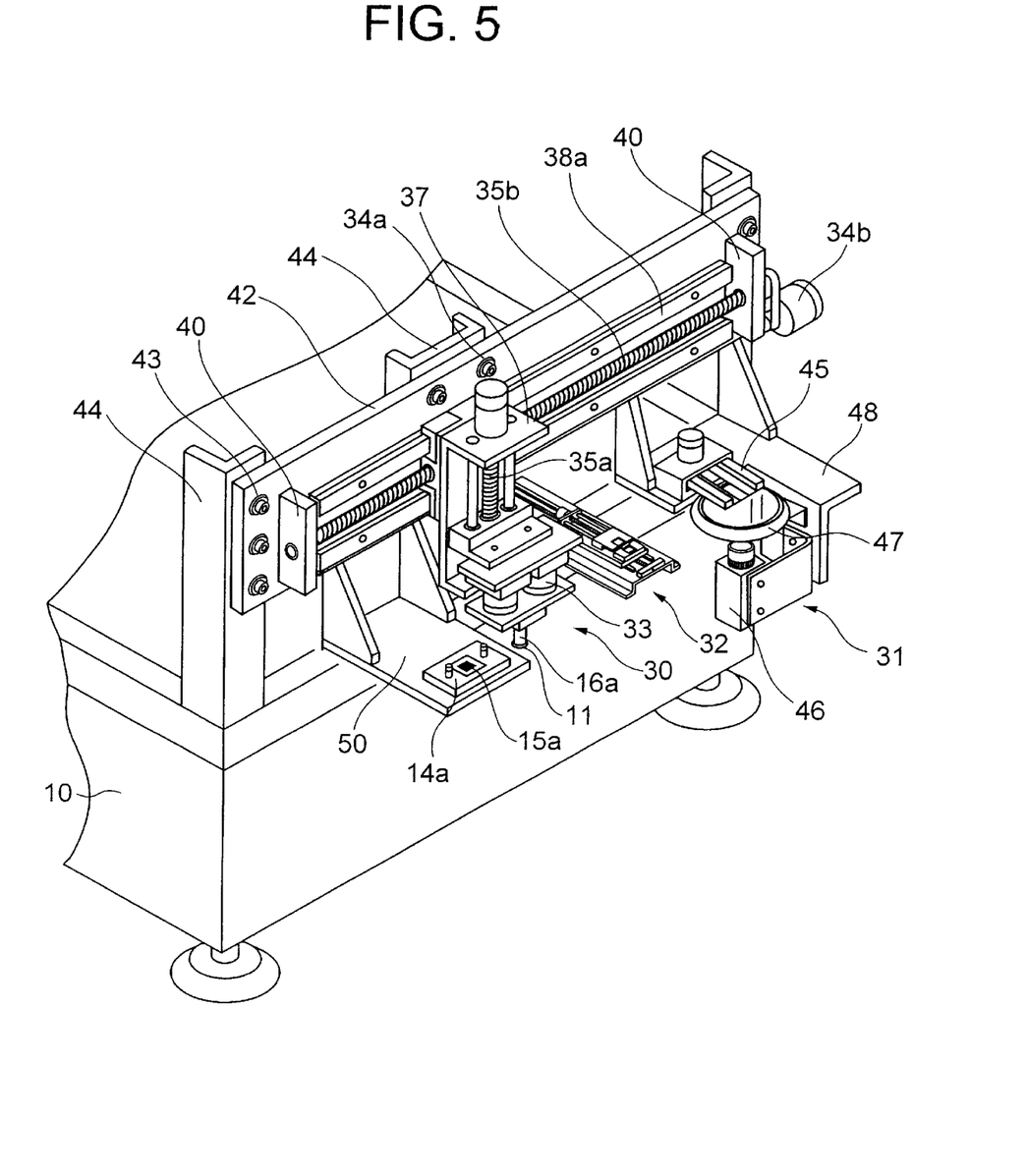
FIG. 5 is a perspective view of an IC test system according to an embodiment of the present invention.

Referring to FIG. 5, an IC test system according to an embodiment of the present invention is shown as observed from the rear side of the fabrication/test conveyer system, although the front side depicted in the drawing is called herein a front side of the test system in this text. The IC test system includes, as main constituent elements thereof, a base or body 10, a carriage arm 30, a positioning member 31, a socket 14a, a shuttle assembly 32 and an IC tester not shown in the figure.

The carriage arm 30 includes a suction head 16a at the bottom of the carriage arm 30, and a screw assembly which includes a vertical screw thread 35a and a pair of screw nuts engaged therewith and sandwiching therebetween a load cell 33. The carriage arm 30 is moved in the direction by rotation of the screw thread 35a driven by a motor 34a disposed on the top of the screw thread 30. A "C"-shaped plate member 37 mounting thereon the screw assembly together with the suction head 16a is coupled with screw nuts engaged with a horizontal screw thread 35b, which is driven by a motor 34b disposed at the right end of the thread 35b. The "C"-shaped member 37 is driven in the horizontal direction along a guide rail 38a extending parallel to the horizontal screw thread 35b. A pair of bearing plates 40 supports the guide rail 38a and the screw thread 35b. The bearing plates 40 and the motor 34b are fixed by bolts and nuts to a base plate 42, which is fixed onto the body 10 or top table of the test system by channel members 44 and bolts 43.

The socket 14a has a depression in which contact pins 15a are arranged. The depression has an upright vertical wall and a wide top opening. The socket 14a is fixed onto a bracket 50, which in turn is fixed onto the base plate 42, and not fixed directly onto the body 10 of the test system. In the above configuration, the base plate 42 can be removed together with the socket 14a and the positioning member 31 in unison by releasing the bolts 43.

The shuttle assembly 32 is used for transferring the BOA packages one by one between the same and the carriage arm 30 before and after testing the BGA packages. Referring to FIGS. 6A to 6D, operation of the shuttle assembly 32 is shown, wherein the forward end thereof is depicted at the front side of the drawing. The shuttle assembly 32 includes a carry-in shuttle 58 and a carry-out shuttle 59 for transferring the BGA packages. The carry-in shuttle 58 moves on the attachment base 57 for transferring a BGA package 11 before testing, whereas the carry-out shuttle 59 moves on the carry-in shuttle 58 for transferring a tested BGA package.

Figures 6A, 6B:
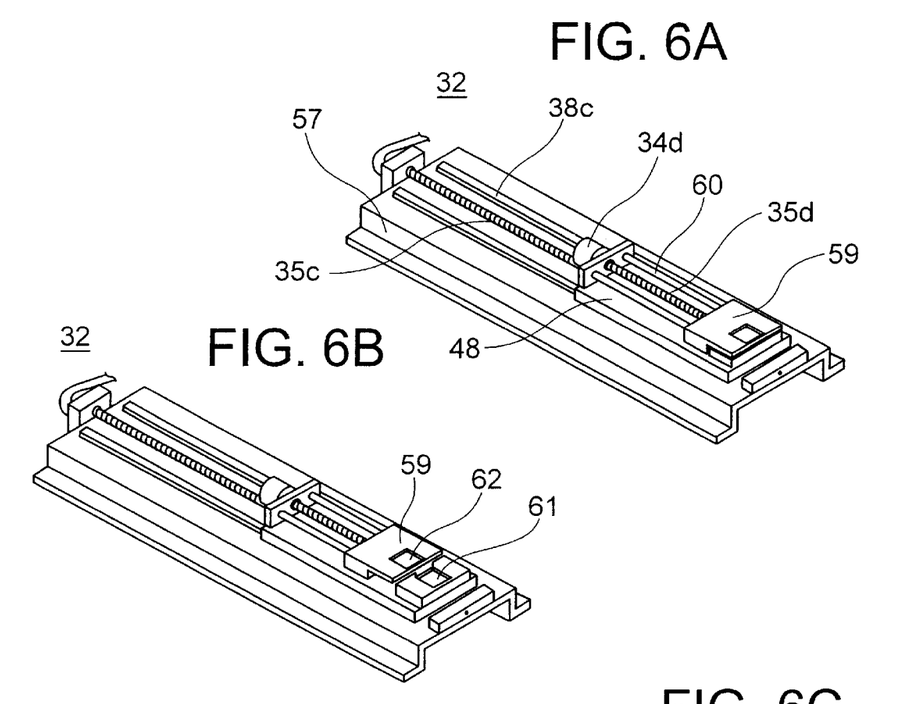
FIGS. 6A to 6D are perspective views of a shuttle assembly in the test system of FIG. 5, consecutively showing he operation of the shuttles therein.

The carry-in shuttle 58 has a nut member at the bottom thereof and is driven by rotation of a screw thread 35c reciprocally along a pair of guide rails 38c fixed onto the attachment base 57. The carry-out shuttle 59 has a nut member at the rear end thereof and is driven by a screw thread 35d and a motor 34d reciprocally along a guide rod 60 mounted on the carry-in shuttle 58. The attachment base 57 is disposed on the table of the test system.

Each of the carry-in shuttle 58 and the carry-out shuttle 59 has a shallow pocket or a stepped depression on the top thereof for receiving a single BGA package substantially without a marginal space. The carry-out shuttle 59 has an "L"-shaped cut-out at the bottom of the front end thereof. Both the pockets overlap each other at the forward end of the shuttle assembly 32.

In FIG. 6A, both the shuttles 58 and 59 wait for operation of the carriage arm at the forward end of the shuttle assembly 32, wherein the pocket 62 of the carry-out shuttle 59, is empty, and the pocket 61 of the carry-in shuttle 59 receives therein a BGA package 11 before testing. In this state, the carriage arm 30 carries a tested BGA package 11, supplies the same in the pocket 62 of the carry-out shuttle 59, moves slightly upward and waits at this position.

In FIG. 6B, the carry-out shuttle 59 moves slightly backward, the carriage arm 30 then moves downward, allows the suction head 16a to hold the BGA package 11 before testing and moves slightly upward.

Figures 6C, 6D:
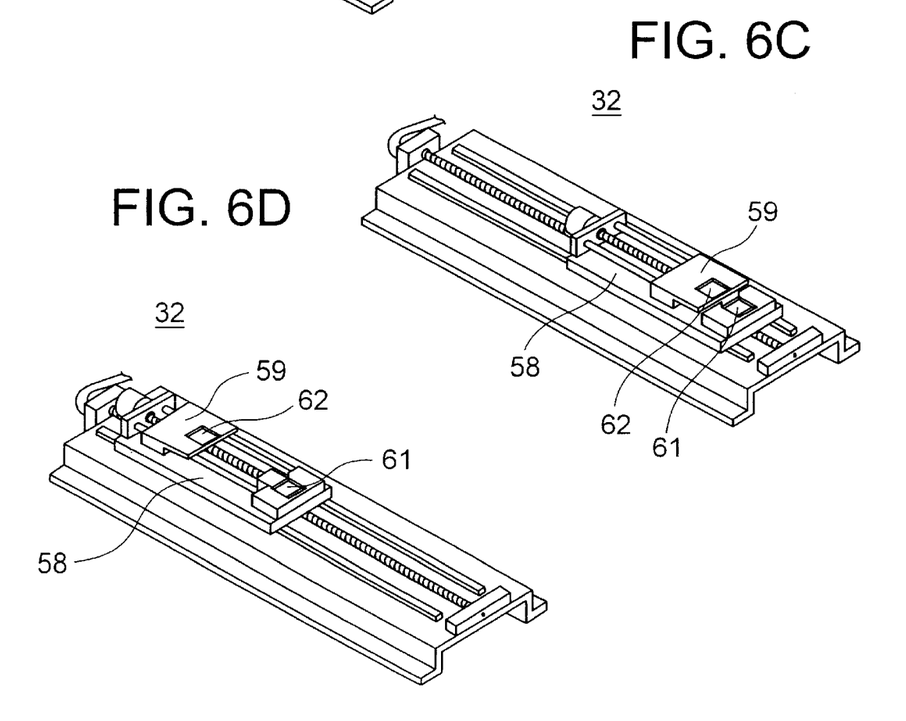

FIG. 6C, the carry-in shuttle 58 starts moving backward, whereas the carry-out shuttle 59 continues moving backward.

In FIG. 6D, the carry-in shuttle 58 stops at the backward end of the span of the movement thereof. At this stage, the carry-out shuttle 59 also reaches the backward end of the shuttle assembly 32. Thereafter, another carriage not shown in FIG. 5 receives the tested BGA package 11 from the pocket 62 of the carry-out shuttle 59 and the pocket 61 of the carry-in shuttle 58 is supplied with a BGA package 11 before testing.

Back to FIG 5, the carriage arm 30 receives the BGA package 11 before testing from the pocket 61 of the carry-in shuttle 58 by vacuum suction, and carries the same toward the positioning member 31. The carriage arm 30 then temporarily transfers the BOA package 11 before testing to a positioning chuck 45 for alignment. The carriage arm 30, after moving upward and waiting a short time, moves downward and receives the aligned BGA package 11 before testing by suction. The carriage arm 30 then moves upward, carries the BGA package 11 above the socket 14a, moves downward to allow the solder balls 12 of the BGA package 11 to contact with the contact pins 15a of the socket 14a. By maintaining this state of the BGA package 11, testing of the BGA package 11 is conducted.

After the testing, the carriage arm 30 moves upward, then toward above the shuttles 58 and 59 while holding the tested BGA package 11 as it is. The carriage arm 30 then transfers the tested BGA package 11 to the carry-out shuttle 59 and receives a new BGA package 11 before testing from the carry-in shuttle 58, as detailed with reference to FIGS. 6A to 6D. At this stage of operations, it is sufficient that the carriage arm 30 move slightly upward and downward Referring to FIG. 7, a test system according to another embodiment of the present invention is similar to the test system shown in FIG. 5 except that a carriage tape 63 is provided in the present embodiment instead of the shuttle assembly 32. The carriage tape 63 has a plurality of pockets arranged along the extending direction of the carriage tape 63. Each pocket receives therein a BGA package 11 before testing, and the carriage tape 63 moves forward at a constant rate by the function of the tape reels 64. The carriage arm 30 receives the BGA package 11 from the carriage tape 63 and allows the IC tester to test the same. The tested BGA package is again received in the pocket of the carriage tape 63 or may be transferred to a carry-out tray not shown.

Figure 7:
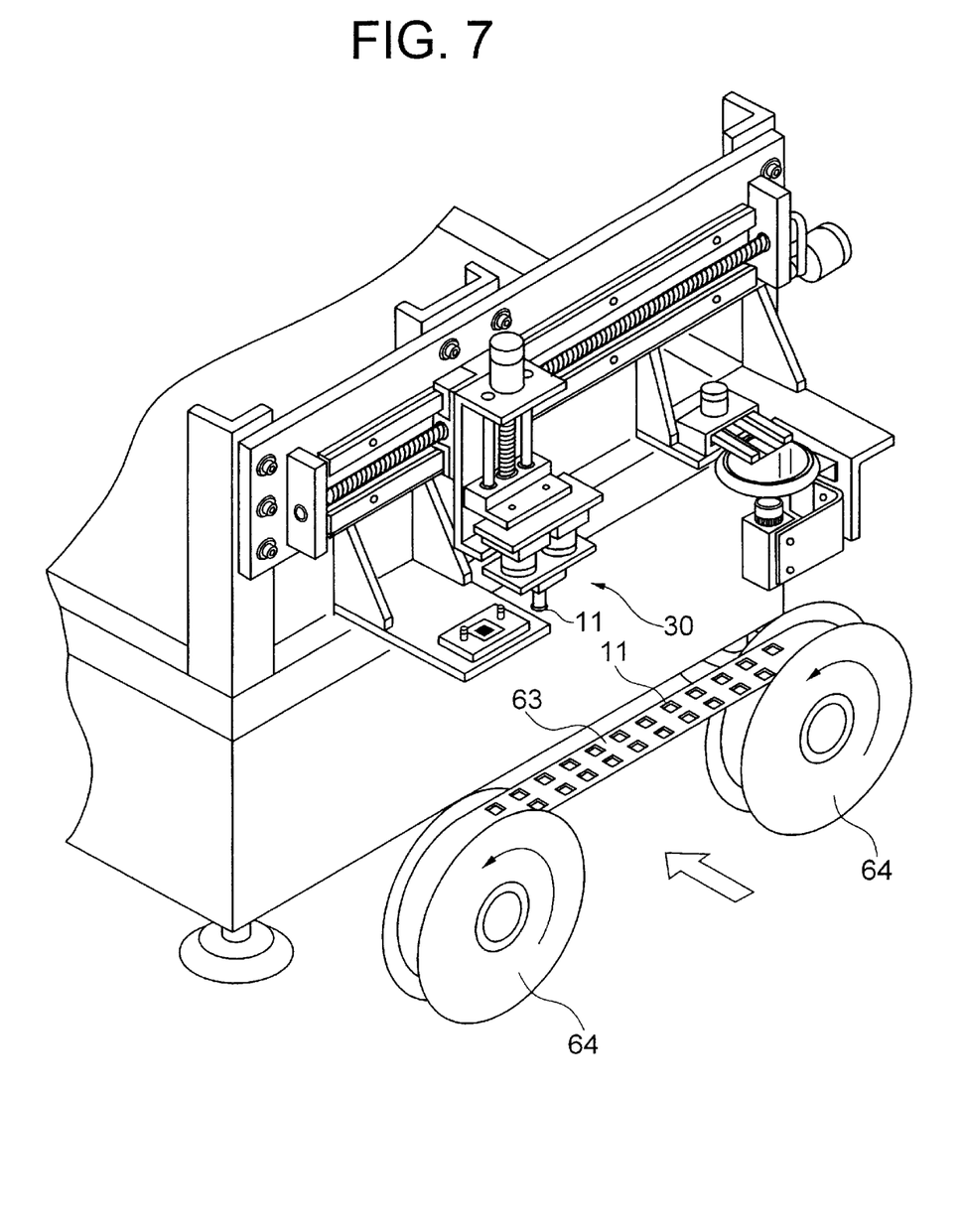
FIG. 7 is a perspective view of an IC test system according to another embodiment of the present invention.

In the configuration of the present embodiment, since the main constituent elements of the test system is provided on the rear edge (or may be side edge) of the fabrication/test system, the carriage tape 63 can be disposed in association with these constituent elements of the test system, such as the carriage arm 30 for transferring the BGA packages.

The advantages of the present invention will be described in detail. As understood from FIG. 5, the carriage arm 30 is the main source of undesirable vibration during operation of the test system. In addition, since the load cell 33 used in the embodiment increases the total weight of the carriage arm 30, the level of the vibration or waggle caused by the carriage arm 30 may be higher. The vibration caused by the carriage arm 30 is transferred through the base plate 42 to the socket bracket 50 and the positioning bracket 48 fixed to the base plate 42 by bolt and nuts.

Accordingly, the socket 14a is also subjected to the vibration caused by the carriage arm 30, whereby the contact pins 15a and the BGA package 11 vibrate similarly to each other when the carriage arm 30 moves downward to allow the solder balls 12 of the BGA package 11 abut against the contact pins 15 of the socket 14a. This provides a correct positioning of the solder balls 12 with respect to respective contact pins 15, thereby allowing a correct testing for the BGA package.

In the positioning member 31, when the carriage arm 30 holds by suction the BGA package 11 before testing aligned by the positioning chuck 45, the suction head 16a and the socket 15a vibrate similarly to each other even if both may have residual vibration or waggle. Thus, the aligned BGA package 11 is held by the suction head 16a without deviating from the reference line, such as a central line, of the suction head 16a, whereby a correct test can be conducted after the carriage of the BGA package 11 by the carriage arm 30 moving downward therefrom toward the socket 14a.

In the above embodiment, the carriage arm 30 is moved by the combination of the screw thread and the guide. However, the carriage arm may be moved by another drive means such as a combination of timing belt and guide. It is preferable in the present invention that all of the members for carrying the BGA package and the associated socket be subjected to the vibration caused by the same member.

The carry-in shuttle 58 and the carry-out shuttle 59 in the shuttle assembly 32 may be driven by an air cylinder or a belt instead of the screw thread.

Since the above embodiments are described only for examples, the present invention is not limited to the above embodiments and various modifications or alterations can be easily made therefrom by those skilled in the art without departing from the scope of the present invention.

What is claimed is:

1. An IC test apparatus comprising a base, a socket including a plurality of contact pins, a positioning member for positioning an IC package with respect to said contact pins, a carriage arm for carrying the IC package positioned by said positioning member to said socket so that external terminals of said IC package are in contact with said contact pins for testing said IC package, wherein said socket, said positioning member and said carriage arm are fixed to a common plate member fixed to said base at an edge of said base, said apparatus further comprising a shuttle assembly including a carry-in shuttle for transferring a BGA package before testing to said carriage arm and a carry-out shuttle for receiving a tested BGA package from said carriage arm, wherein each of said carry-in shuttle and said carry-out shuttle moves straight and reciprocally at different speeds.

2. The IC test system as defined in claim 1, wherein said carry-out shuttle moves on a top surface of said carry-in shuttle.

3. The IC test system as defined in claim 2, wherein positions at which said carry-in shuttle and said carry-out shuttle receive a BGA package from said carriage arm substantially overlap with one another as viewed in a vertical direction.

4. The IC test system as defined in claims 1, further comprising a carrier tape for transferring IC packages before testing, wherein said carriage arm receives IC packages from said carrier tape.

5. The IC test system as defined in claim 1, wherein each of said carry-in shuttle and said carry-out shuttle has a pocket on a top thereof for receiving a single BGA package substantially without a margin space.

* * * * *

UNITED STATES PATENT AND TRADEMARK OFFICE
CERTIFICATE OF CORRECTION

PATENT NO. : 6,462,533 B1
DATED : October 8, 2002
INVENTOR(S) : Shimizu

It is certified that error appears in the above-identified patent and that said Letters Patent is hereby corrected as shown below:

<u>Column 1,</u>
Line 20, "BOA" should read -- BGA --.

<u>Column 8,</u>
Line 12, "claims" should read -- claim --.

Signed and Sealed this

Twenty-second Day of June, 2004

JON W. DUDAS
*Acting Director of the United States Patent and Trademark Office*